United States Patent [19]
Koyanagi et al.

[11] Patent Number: 6,114,916
[45] Date of Patent: *Sep. 5, 2000

[54] OSCILLATION APPARATUS

[75] Inventors: Miyuki Koyanagi; Koichi Murakami, both of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/923,527

[22] Filed: Sep. 4, 1997

[30] Foreign Application Priority Data

Feb. 17, 1997 [JP] Japan .................................. 9-032036

[51] Int. Cl.⁷ .................................................. H03L 7/099
[52] U.S. Cl. .............................. 331/55; 331/46; 331/47; 331/48; 327/131; 327/135; 327/113
[58] Field of Search .................................. 331/46, 47, 48, 331/55, 1 A; 327/131, 134, 135, 136, 113

[56] References Cited

U.S. PATENT DOCUMENTS

| | | | |
|---|---|---|---|
| 4,260,959 | 4/1981 | Aligood | 331/111 |
| 4,912,433 | 3/1990 | Motegi et al. | 331/8 |
| 5,420,550 | 5/1995 | May | 331/143 |
| 5,473,641 | 12/1995 | Brauduin | 375/376 |
| 5,815,045 | 9/1998 | Koyanagi et al. | 331/143 |

FOREIGN PATENT DOCUMENTS 9-64645  3/1997  Japan .

OTHER PUBLICATIONS

U.S. application No. 08/645,752, Miyuki Koyagani et al., filed May 14, 1996.

Primary Examiner—Arnold Kinkead
Attorney, Agent, or Firm—Staas & Halsey

[57] ABSTRACT

An oscillation apparatus is provided with a signal input unit for supplying a pulse sequence consisting of pulses sequentially continuously occurred; a state quantity generating unit for generating state quantity having a value which is monotonously increased with the passage of time; a state quantity transition unit for transferring a value of state quantity in the course of generation in said state quantity generating unit to a value changed by a predetermined amount in a varying direction of the value of the state quantity with respect to a present value of the state quantity, whenever one pulse is fed from said signal input unit to said state quantity transition unit; a state quantity reset unit for comparing the present value of the state quantity generated in said state quantity generating unit with a predetermined threshold value, and resetting the present value of the state quantity generated in said state quantity generating unit to a predetermined initial value when the present value reaches the threshold value; and a signal generating unit for generating sequentially signals of which a period is defined by a time interval of timing-to-timing in which the state quantity is reset to the initial value.

4 Claims, 7 Drawing Sheets

OSCILLATION APPARATUS

BACKGROUND OF THE INVENTION

1. Field of the Invention

The present invention relates to an oscillation apparatus.

2. Description of the Related Art

Hitherto, various types of oscillation apparatuses have been used in extensive fields.

As technology of stabilizing a frequency of an oscillation signal in the conventional oscillation apparatus, there is adopted, for example, a PLL scheme in which an external periodic signal as a reference signal is inputted, a deviation from the external periodic signal is detected, and there is provided such a regulation that when a deviation occurs owing to a disturbance and the like, such a deviation disappears as soon as possible.

By the way, now let us consider, for example, the rhythm of the human life. It will happen that when a person wakes up earlier than usual in a certain morning owing to some causes, the person will begin to feel sleepy earlier than usual on the day, and the earlier sleeping may involve the earlier waking up in the morning. In this manner, an influence of the disturbance such that a person wakes up earlier than usual on a certain morning will not be restored immediately, but will be recovered little by little to ones former rhythm over several days.

Also it happens that for example, when a person plays a musical instrument along to metronome sounds and is aware of the fact that he plays without harmonizing with the metronome sounds, it is preferable that the musical performance is regulated little by little slowly so as to harmonize with the metronome sounds in such a manner that an audience does not feel out of place.

Further, also it happens that for example, when the metronome sounds are too fast to meet his musical performance pace, the metronome sounds are neglected every other sound to conduct a performance with a half tempo, or oppositely, when the metronome sounds are too slow to meet his musical performance pace, the performance is conducted at twice tempo as compared with the metronome sounds.

Recently, there has been developed a system in which an artificial creature is built in a computer and behaves in the computer just as if the artificial creature has one's own intention and emotion. With regard to such a system, there is made an effort such that the rhythm of the artificial creature and a tempo of the musical performance approaches that of the actual creature, but not the robot-like one. In order to produce the fundamental living rhythm of the artificial creature or to produce a tempo of the musical performance in the event that the musical performance is to be conducted without remarkably changing a tempo of the musical performance, a kind of oscillation apparatus is used. In such a use, it is preferable to adopt an oscillation apparatus which is operative in such a manner that an influence of the disturbance is not restored immediately, but is recovered little by little over a predetermined time, as mentioned above, and in addition, in another situation, the oscillation apparatus oscillates in a period not identical to a period of the external signal, but having a certain relation with respect to the period of the external signal, such as half or twice of the period of the external signal.

By the way, when it is intended that such an oscillation apparatus is implemented through the prior art, there may be considered, for example, an arrangement in which an variation in a frequency of an oscillation signal due to the disturbance is detected and a frequency of an external periodic signal is varied, and the varied frequency of the external periodic signal is recovered little by little over a predetermined time so that the oscillation frequency is recovered taking the predetermined time. However, according to these systems, the oscillator itself intends to oscillate as faithfully as possible, and it is obliged to control the frequency of the external periodic signal. This involves such a problem that the structure is complicated.

In order to solve such a problem, it is preferable to implement an oscillation apparatus which is operative in such a manner that an oscillation frequency is recovered little by little on a self-control basis in the interior, but not to access from the exterior, and in addition, in another situation, the oscillation apparatus oscillates in a period not identical to a period of the external signal, but having a certain relation with respect to the period of the external signal.

An oscillation apparatus, which satisfies such a requirement, has been proposed by the inventors of the present application (cf. Japanese Patent Application No. 7-211899) which corresponds to U.S. Pat. No. 5,815,045. According to the proposed oscillation apparatus, however, there is a need to feed from the exterior an input signal, which periodically varies in value, for example, having a sine wave, and it is impossible to feed from the exterior a pulse sequence consisting of sequentially continued pulses to generate a signal synchronized with the pulse sequence.

In view of the recent tendency of a digitalization of signal processings, it is preferable to provide an oscillation apparatus in which a pulse sequence is fed from the exterior so that a signal synchronized with the pulse sequence can be generated.

SUMMARY OF THE INVENTION

In view of the foregoing, it is therefore an object of the present invention to provide an oscillation apparatus capable of recovering little by little an oscillation frequency on a self-control basis in the interior, and capable of oscillating in a period not identical to a period of an external periodic signal, but having a certain relation with respect to the period of the external periodic signal, wherein these operations may be implemented by feeding the pulse sequence from the exterior.

FIG. 1 is a block diagram for an explanation of a principle of the present invention.

An oscillation apparatus according to the present invention comprises:

signal input means 11 for supplying a pulse sequence consisting of pulses sequentially continuously occurred;

state quantity generating means 12 for generating state quantity having a value which is monotonously increased with the passage of time;

state quantity transition means 13 for transferring a value of state quantity in the course of generation in said state quantity generating means 12 to a value changed by a predetermined amount in a varying direction of the value of the state quantity with respect to a present value of the state quantity, whenever one pulse is fed from said signal input means 11 to said state quantity transition means 13;

state quantity reset means 14 for comparing the present value of the state quantity generated in said state quantity generating means 12 with a predetermined threshold value, and resetting the present value of the state quantity generated in said state quantity generating means 12 to a predetermined initial value when the present value reaches the threshold value; and signal generating means 15 for generating sequentially signals of which a period is defined by a time interval of timing-to-timing in which the state quantity is reset to the initial value.

Here, it is preferable that said oscillation apparatus further comprises transition quantity designating means 16 for optionally designating the predetermined amount.

Further, in said oscillation apparatus it is preferable that said state quantity generating means 12 generates the state quantity, which varies in value from the initial value toward the threshold value, while a variation rate of the value is decreased with the passage of time, except for a timing of transition of a value of the state quantity by the state quantity transition means 13, and a timing of reset of the state quantity.

In the oscillation apparatus as mentioned above, it is preferable that said oscillation apparatus further comprises variation factor designating means 17 for designating a variation factor of the variation rate of a value of the state quantity with the passage of time.

Further, in the oscillation apparatus as mentioned above, it is preferable that said oscillation apparatus further comprises period detecting means 18 for detecting a period of the pulses constituting the pulse sequence inputted through the signal input means 11, and initial variation rate designating means 19 for designating an initial variation rate of the value of the state quantity reset to the initial value in accordance with the period detected by the period detecting means 18.

Furthermore, in the oscillation apparatus as mentioned above, it is preferable that said oscillation apparatus further comprises phase detecting means 20 for detecting a phase difference between the pulse sequence inputted through the signal input means 11 and the signal generated in the signal generating means 15, and initial variation rate fine control means 21 for designating a fine control amount of the initial variation rate of the value of the state quantity reset to the initial value in accordance with the phase detected by the phase detecting means 20.

DESCRIPTION OF THE PREFERRED EMBODIMENTS

Hereinafter, there will be described embodiments of the present invention.

Figure 1:
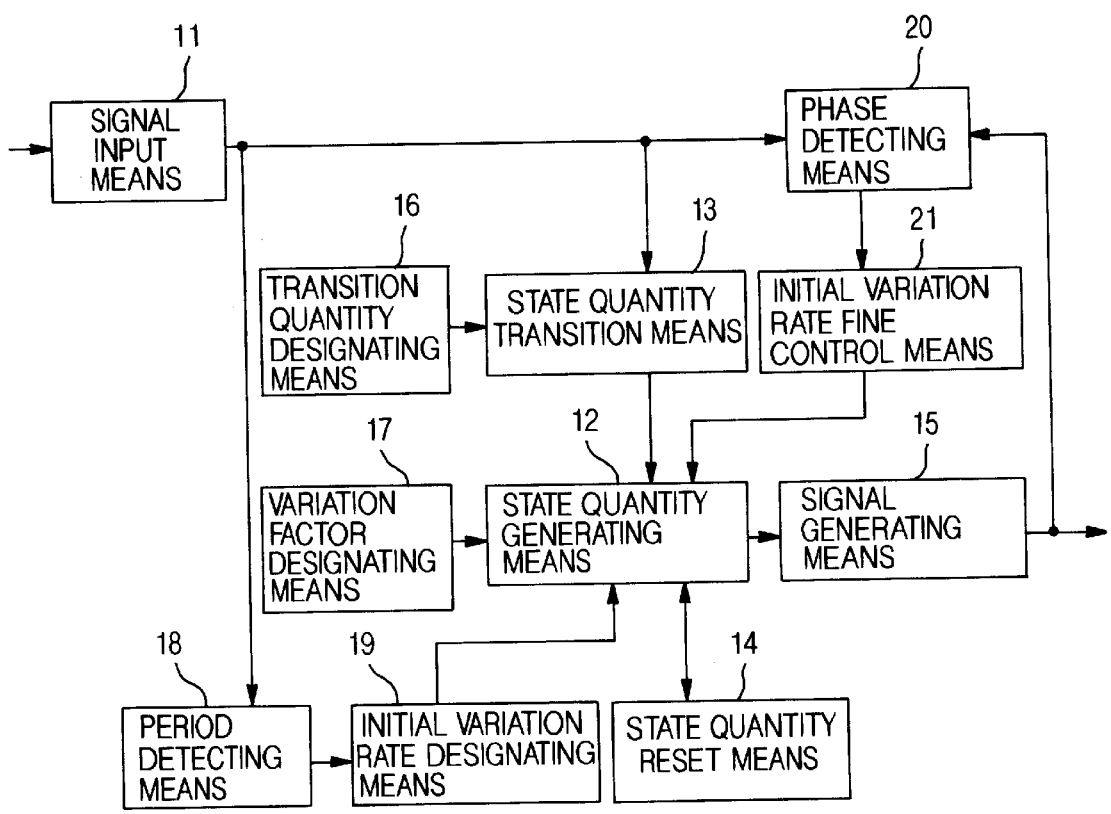
FIG. 1 is a block diagram for an explanation of a principle of the present invention.
Figure 2:
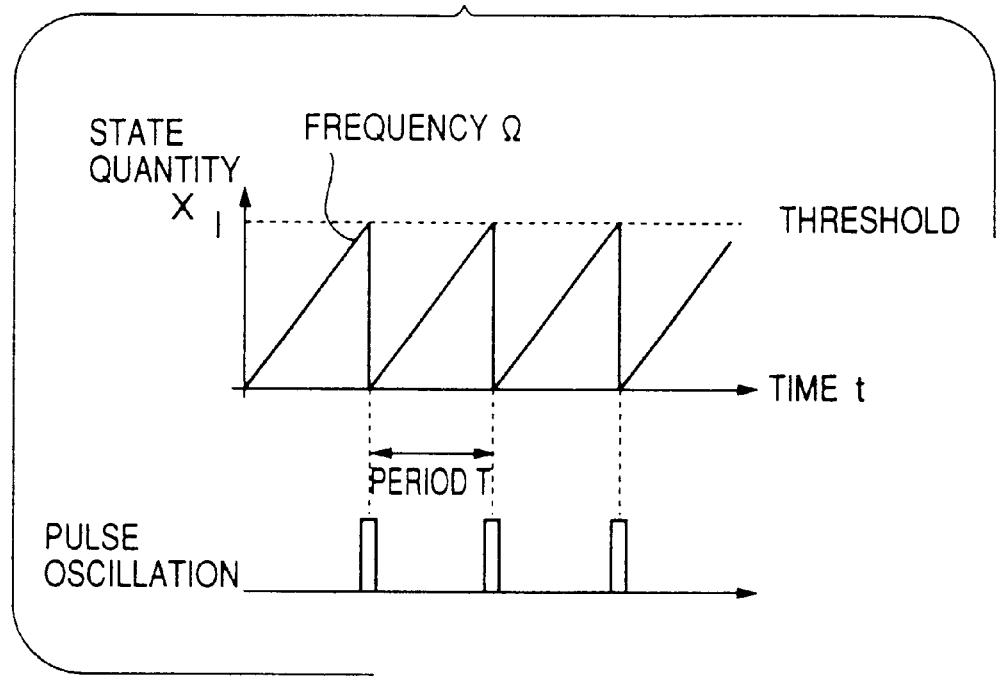
FIG. 2 is an explanatory view useful for understanding a principle of an integrate and fire type of oscillation apparatus.

According to the present embodiments, an oscillation apparatus is essentially of an integrate and fire type. The integrate and fire type of oscillation apparatus may be defined by an oscillation apparatus in which as shown in FIG. 2, one pulse signal is generated when a state quantity (e.g. voltage), which increases with a frequency (gradient) $\Omega$, reaches a threshold, so that the state quantity returns to zero, and hereafter similarly, this process is repeatedly performed. A characteristic of an oscillation of such a type of apparatus is expressed by $$x_{n+1} = x_n + \Omega \cdot (t_{n+1} - t_n) \tag{1}$$

$$x_{n+1} \geq 1 \Rightarrow x_{n+1} = 0 \quad \text{(firing)}$$

where $t_n$ and $t_{n+1}$ denote coordinate points on a time axis, and $x_n$ and $x_{n+1}$ denote values of state quantity at the points of times $t_n$ and $t_{n+1}$, respectively.

Figure 3:
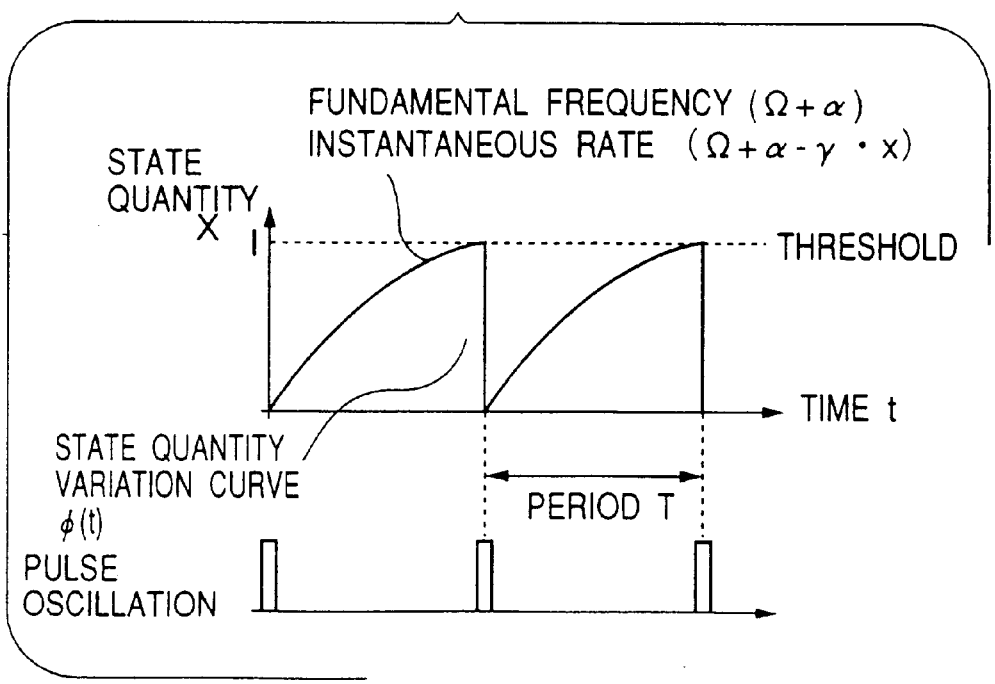
FIG. 3 is an explanatory view useful for understanding a basic operation of the present embodiment.

Here, in order to establish a stable synchronization and emphasize an adaptability to the external period, a pulse oscillator as shown in FIG. 3 is prepared based on the oscillator shown in FIG. 2. A characteristic of this pulse oscillator is expressed by $$x_{n+1} = x_n + (\Omega + \alpha - \gamma \cdot x_n) \cdot (t_{n+1} - t_n) \tag{2}$$

$$x_{n+1} \geq 1 \Rightarrow x_{n+1} = 0 \quad \text{(firing)}$$

where, $\Omega$: fundamental frequency $\gamma$: state quantity variation factor (at $\gamma \geq 0$, a variation rate of a state quantity is decreased in proportion to the state quantity)

$\alpha$: fundamental frequency control variable (usually, $\alpha = 0$)

It is noted that the fundamental frequency $\Omega$, the state quantity variation factor $\gamma$ and the fundamental frequency control variable $\alpha$ correspond to the "initial variation rate", the "variation factor of variation rate", and the "fine control quantity of the initial variation rate", respectively, referred to in the present invention. According to equation (2), for example, as shown in FIG. 3, there is defined a curve having a gradient (variation rate) of ($\Omega + \alpha$) at the point of time x=0, wherein the variation rate is gradually decreased in accordance with the state quantity variation factor $\gamma$ and the state quantity x. This curve is referred to as a state quantity variation curve and is expressed by $\Phi(t)$.

First, let us consider the case of $\alpha = 0$. For establishing a synchronization with a pulse signal fed from the exterior, the following action is defined, that is, when the pulse signal fed from the exterior is detected, the state quantity $x_n$ at that time is expressed by $$x_n' = x_n + K$$

where K denotes a state variation amount (a "predetermined amount" transition value referred to in the present invention) to the external pulse.

Figure 4:
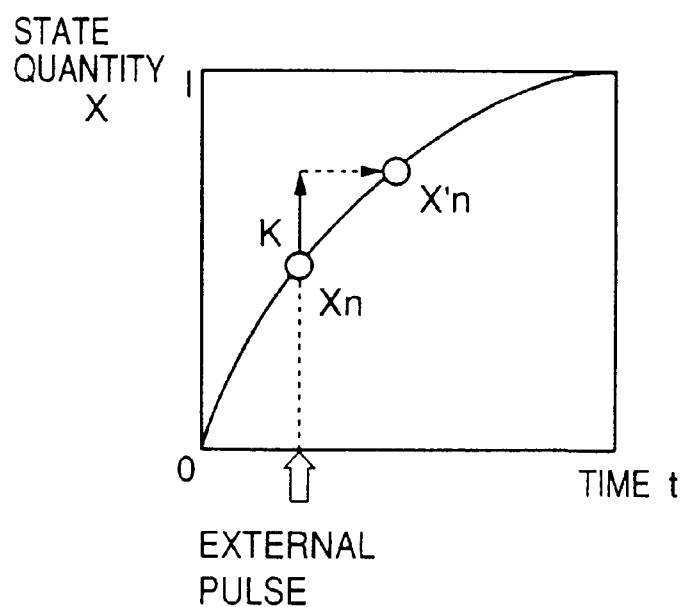
FIG. 4 is an explanatory view useful for understanding a processing for an external pulse.

The expression implies that an application of the pulse from the exterior causes the state quantity $x_n$ to be rapidly increased (or decreased), thereby bringing about a rapid phase lead (or lag) of the oscillator, as shown in FIG. 4. Consequently, if the external pulse is applied when the state of the oscillator is in an area defined by a hatched portion of FIG. 5, the oscillator will immediately fire so that the state quantity returns to zero. Thus, as far as the frequency of pulses of the external pulse sequence and the eigen frequency of the oscillator are maintained within a specific range in their difference, an output of the oscillator will completely synchronize with the external period. In order to establish a synchronization of the oscillator with the external period, it is necessary for the oscillator that the state reaches the hatched portion shown in FIG. 5 in the event that the oscillator immediately fires in accordance with an external pulse at a certain point of time and thereafter the successive external pulse is applied. That is, if the following condition is satisfied, the oscillator synchronizes with the external pulse sequence.

$$1 - K \leq \Phi(T_o) \leq 1$$

where $T_o$ denotes a period of the external pulse

Figure 6:
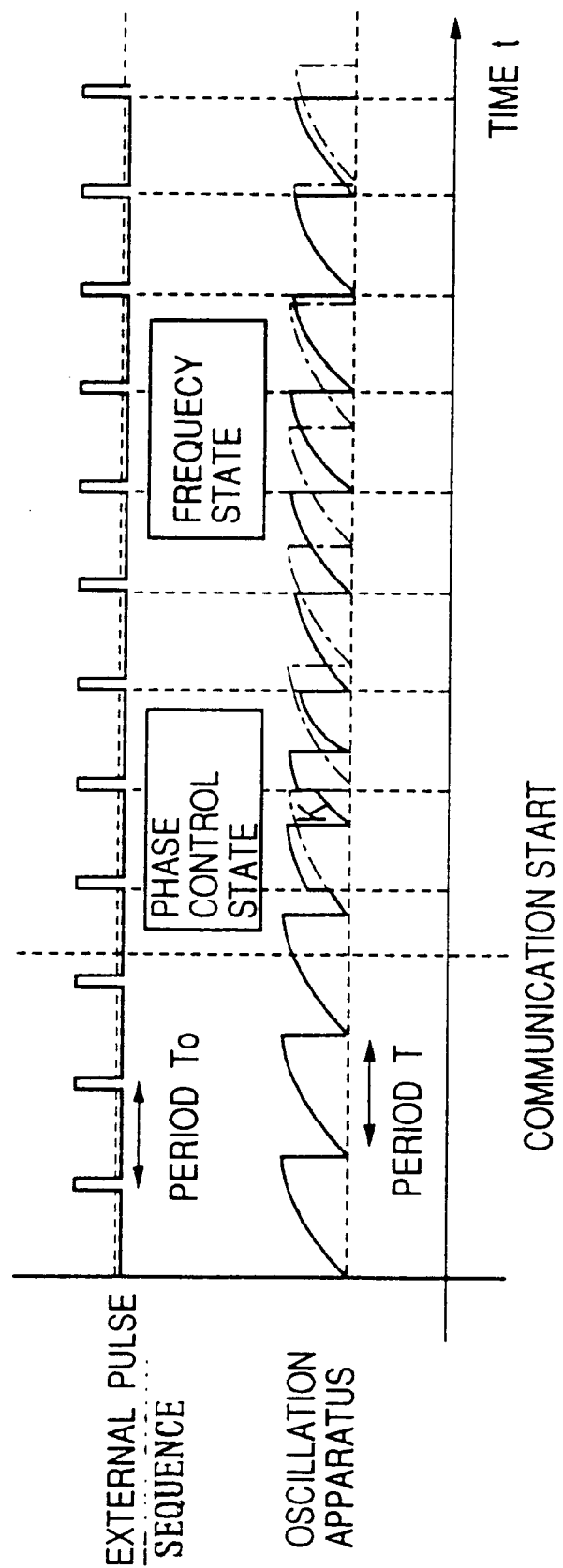
FIG. 6 is a view useful for understanding a process in which a synchronization is established in the event that the external period and the natural period are close on one another.

FIG. 6 is a view useful for understanding a process in which a synchronization is established in the event that the external period and the natural period are close on one another.

As seen from FIG. 6, the state variation amount K to the external pulse is representative of the intensity of a coupling force of the oscillator with the external period. A time required for an establishment of the synchronization with the external pulse sequence is shortened with greater K. Further, it is possible to establish the synchronization even if there is provided a larger difference between a period of pulses of the external pulse sequence and a fundamental period defined by one's own fundamental frequency. That is, the state variation amount K defines a velocity control ability of the oscillator to the external pulse sequence.

Figure 5:
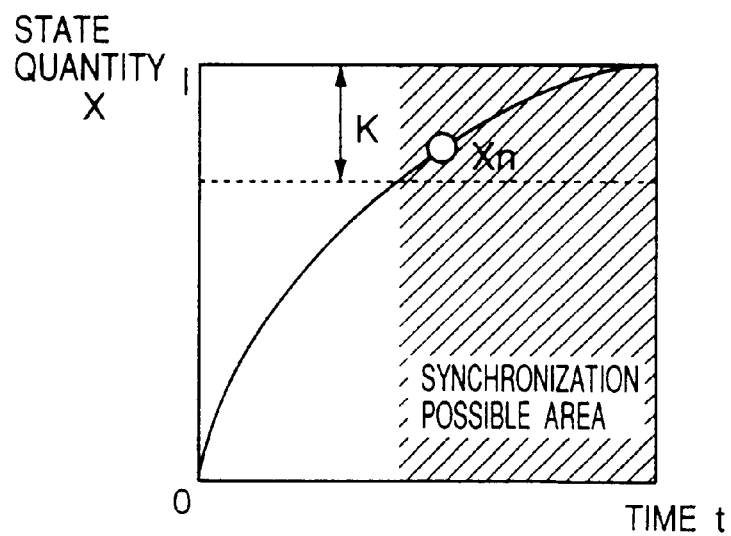
FIG. 5 is an explanatory view useful for understanding a synchronization possibility condition.

The hatched portion shown in FIG. 5 varies in an area size also in accordance with the state quantity variation factor γ. The state quantity variation factor γ serves to decrease the variation rate of the state quantity as the state quantity increases. This feature causes the variation rate to be extremely decreased, particularly, when the state quantity x is close to the threshold value. Consequently, the synchronization possible area indicated by the hatched portion in FIG. 5 spreads with a greater γ. This implies that the synchronization can be maintained even if there is a fluctuation on the period of the external pulse.

Figure 7:
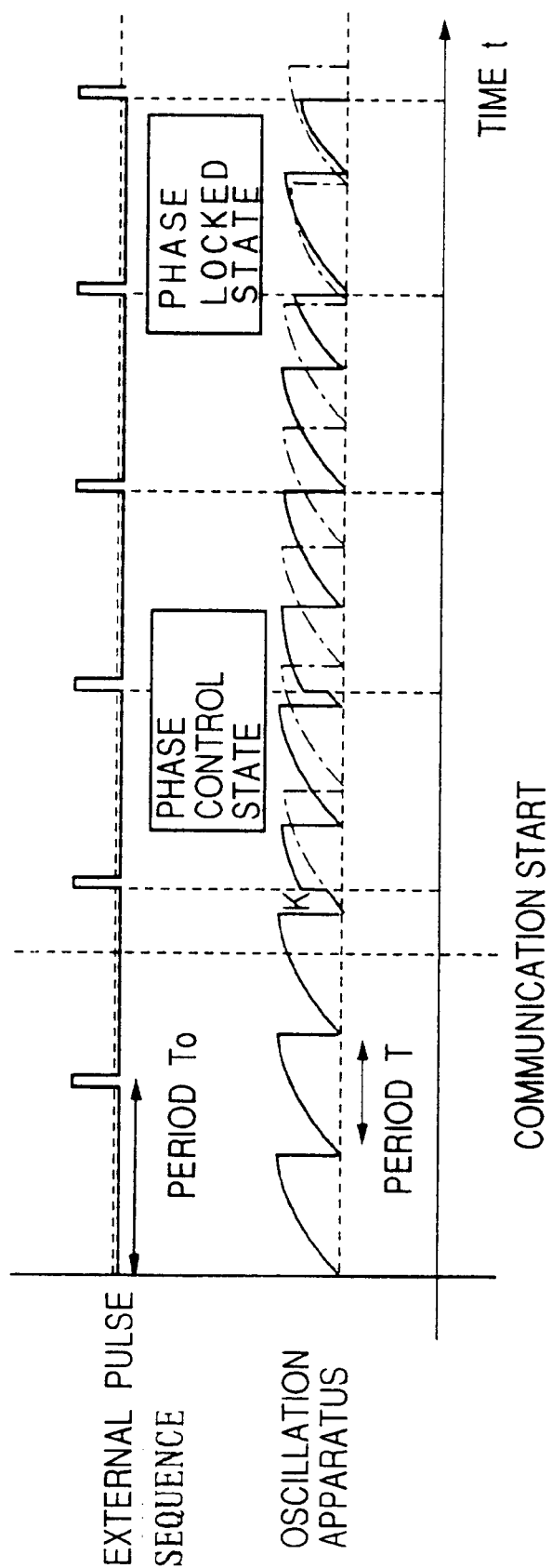
FIG. 7 is a view useful for understanding a process in which a phase-locked state is established in the event that the external period and the natural period are apart form one another.

FIG. 7 is a view useful for understanding a process in which a phase-locked state is established in the event that a period of the external pulse sequence and the fundamental period of the oscillator are remarkably different form one another.

As shown in FIG. 7, in the event that a period of the external pulse sequence and the fundamental period of the oscillator are remarkably different form one another, in this oscillator a phase relation between those periods is fixed onto a suitable rational number ratio. This is referred to as a phase-locked state. That is, this oscillator has such an ability that when the fundamental frequency of the oscillator is fixed onto a predetermined value, the state of the synchronization or the phase lock is maintained with respect to any rate of periodical pulse signals fed from the exterior.

Figure 8:
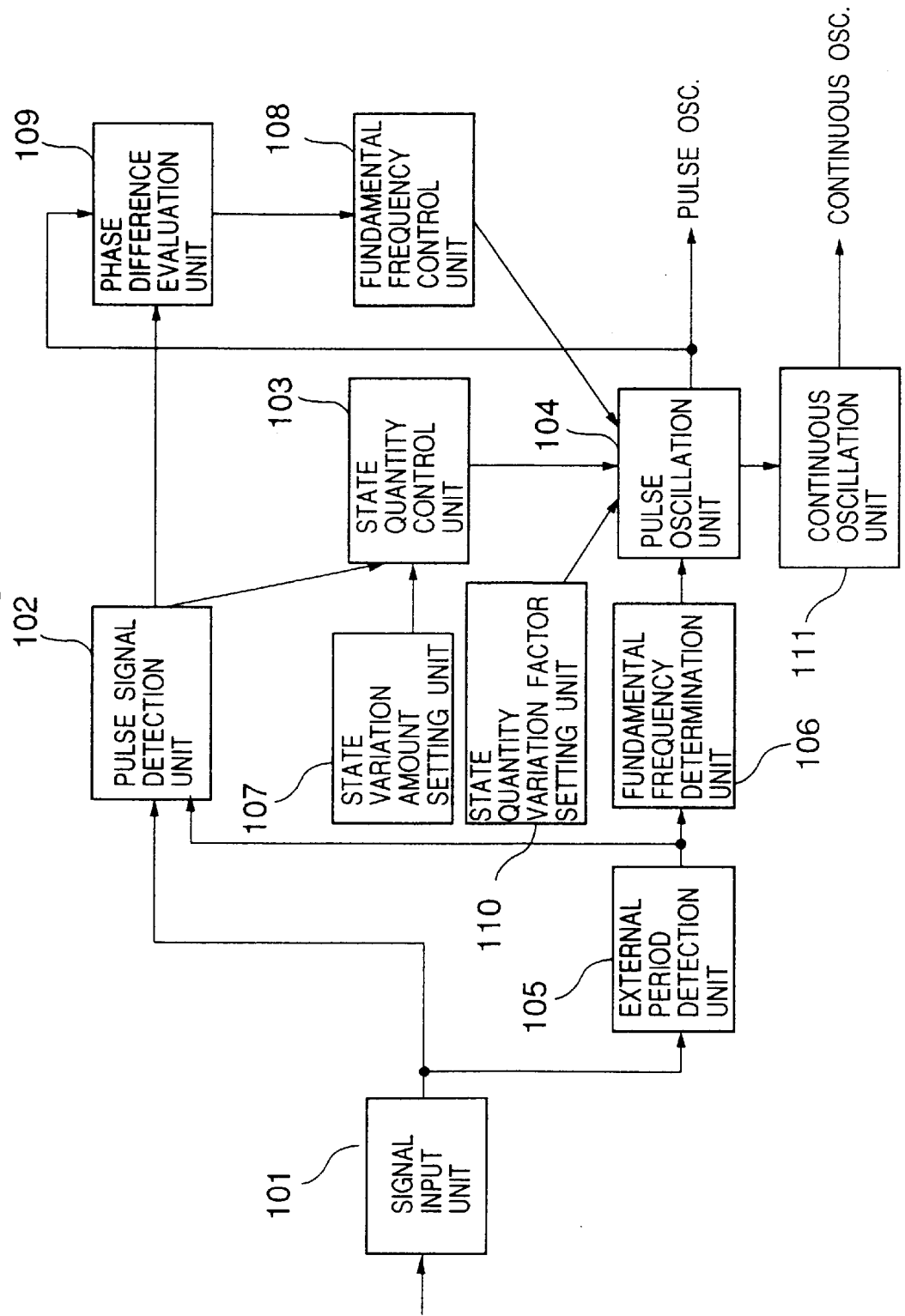
FIG. 8 is a block diagram of an oscillation apparatus according to one embodiment of the present invention.

FIG. 8 is a block diagram of an oscillation apparatus according to one embodiment of the present invention adopting the above-mentioned principle.

A signal input unit 101 receives a periodic pulse signal from the external. A pulse signal detection unit 102 detects the periodic pulse signal entered through the signal input unit 101 and transmits the same into the oscillation apparatus. Hence, according to the present embodiment, a combination of the signal input unit 101 and the pulse signal detection unit 102 corresponds to an example of the signal input means referred to in the present invention.

A state quantity control unit 103 is operative in response to a detection of the external pulse by the pulse signal detection unit 102 to increase (or decrease) a state quantity x of a pulse oscillation unit 104 by a state variation amount K. The state quantity control unit 103 corresponds to the state quantity transition means 13 referred to in the present invention.

The pulse oscillation unit 104 implements the basic function of the oscillator shown in FIG. 3. That is, according to the pulse oscillation unit 104, the state quantity x is increased with the passage of time, and when reaching the threshold a firing occurs to reset the state quantity so as to return to the initial value 0, and a pulse is generated at that timing. Consequently, the pulse oscillation unit 104 corresponds to a combination of the state quantity generating means, the state quantity reset means and the signal generating means referred to in the present invention.

An external period detection unit 105 corresponds to the period detecting means referred to in the present invention, and detects a period $T_o$ of the pulse sequence fed from the exterior. While it is permitted that the fundamental frequency Ω is set up beforehand in the form of characteristics of the oscillation apparatus, according to the embodiment of the present invention, the oscillation apparatus is provided with a fundamental frequency determination unit 106 corresponding to the initial variation rate designating means referred to in the present invention. The use of the fundamental frequency determination unit 106 makes it possible to refresh the setting of the fundamental frequency Ω in accordance with the external period $T_o$ detected by the external period detection unit 105 so as to provide a fundamental frequency suitable for an establishment of the synchronization with the external pulse sequence. Thus, even in the event that the external period $T_o$ offers a value which involves a phase lock of a rational number ratio such as 1:2 if the fundamental frequency of the oscillation apparatus is not altered, it is possible to establish a synchronization of 1:1.

Also with respect to the state variation amount K, while it is permitted that the state variation amount K is set up beforehand in the form of characteristics of the oscillation apparatus, according to the present embodiment of the present invention, the oscillation apparatus is provided with a state variation amount setting unit 107 corresponding to the transition quantity designating means referred to in the present invention. The use of the state variation amount setting unit 107 makes it possible to refresh setting of the state variation amount K, since the rate control ability of the oscillation apparatus to the external pulse sequence is altered, thereby dynamically altering the rate control ability of the oscillation apparatus.

The fundamental frequency control variable α is controlled by a fundamental frequency control unit 108. The fundamental frequency control unit 108 controls on a fine basis the fundamental frequency Ω which has been set up on a rough basis by the fundamental frequency determination unit 106 so that the fundamental frequency shifts to an optimum value suitable for an establishment of the synchronization with the external period. Performing a fine control of the fundamental frequency makes it possible to establish a synchronization between the period of the oscillator apparatus and the external period in such a manner that when the external period slowly varies in its rate, the oscillation apparatus also slowly varies in its frequency in accordance with a variation of the external period. The fundamental frequency is subjected to a fine control in such a manner that when it is determined by a phase difference evaluation unit 109 that the fundamental frequency of the oscillation apparatus is too higher than that of the external sequence, the fundamental frequency is decrease, and on the other hand, when it is determined by a phase difference evaluation unit 109 that the fundamental frequency of the oscillation apparatus is too lower than that of the external pulse sequence, the fundamental frequency is increased. The phase difference evaluation unit 109 corresponds to the phase detecting means referred to in the present invention, and evaluates a phase difference between an external pulse and a pulse generated in the pulse oscillation unit 104 at the time when the external pulse is detected, so that a suitability of the fundamental frequency is determined based on a variation in the recent phase difference. And as a result, the fundamental frequency control unit 108 operates to increase or decrease for some time the value of the fundamental frequency control variable α on the basis of a determination result of the suitability. When the value of the fundamental frequency control variable α has been set up suitably, the phase difference evaluation unit 109 determines, in view of the oscillation of the oscillation apparatus, that the frequency setting has been made suitably. Utilizing the value of the fundamental frequency control variable α now set up as it is implies that an optimum value for an establishment of the synchronization with the external pulse sequence, as the fundamental frequency used in the pulse oscillation unit 104, is set up. Further, it is possible to follow also a slow transition of the external pulse sequence.

It is also permitted that the state quantity variation factor γ is set up beforehand in the form of characteristics of the oscillation apparatus. The state quantity variation factor γ defines a decreasing ratio of the state variation rate in the pulse oscillation unit 104. The synchronization possible area indicated by the hatched portion in FIG. 5 spreads with a greater γ, so that a rate control ability to the external pulse sequence is emphasized. According to a state quantity variation factor setting unit 110 which corresponds to the variation factor designating means, it is possible to refresh the value of γ in setting up. Emphasizing the rate control ability through providing great γ implies emphasizing a tolerance ability for a fluctuation of pulse intervals of the external pulse sequence or a small delay.

A continuous oscillation unit 111 generates a continuous oscillation signal having the same frequency as that of the pulse oscillation in the pulse oscillation unit 104 and varying in value on a sine wave basis. In some cases of the use of an oscillation, it happens that a sine wave of oscillation signal is better. The continuous oscillation unit 111 makes it possible to generate a continuous oscillation signal synchronized with the external pulse sequence. It is noted that the continuous oscillation unit 111 constitutes together with the pulse oscillation unit 104 the signal generating means referred to in the present invention.

For the better understanding of the operation of the oscillation apparatus shown in FIG. 8, there will be explained a case wherein a synchronization performance is carried out in such a manner that a computer controls its tempo in compliance with a tempo of a music which a person plays. It is assumed that the computer incorporates therein a software to implement the oscillation apparatus shown in FIG. 8.

It is also assumed that the external signal, which is applied to the oscillation apparatus implemented in the computer, is a pulse signal, such as ON/OFF of sounds, which is obtained through a result of a conversion of continuous messages of sounds which a person plays into a pulse signal.

The external period detection unit 105 detects a period $T_o$ of the external period signal.

The fundamental frequency determination unit 106 sets up a fundamental frequency Ω so that the natural period T of the oscillation apparatus delays a little as compared with the external period $T_o$, when the external period detection unit 105 detects a large variation in the external period $T_o$. The oscillation apparatus has such a property that the faster rate of the oscillation apparatus than the external period $T_o$ involves a phase lock of rational number ratio such as 1:2. If this is disliked and it is desired to establish a synchronization of 1:1, it is effective that the fundamental frequency Ω of the oscillation apparatus is set up to be a little slower than the external period. In this manner, the fundamental frequency determination unit 106 roughly controls the fundamental frequency of the oscillation apparatus according to the external period.

The pulse oscillation unit 104 varies its state quantity x with the passage of time, and when reaching a certain threshold, a firing occurs to reset the state quantity so as to return to the initial value 0, and a pulse is generated at that timing. Consequently, the pulse oscillation unit 104 implements the basis oscillation of the oscillator shown in FIG. 3.

The pulse signal detection unit 102 is operative, only when the external period detection unit 105 detects the external period $T_o$, to detect a pulse representative of a tempo of the input external signal and transmit the pulse thus detected to all to whom the pulse shall come in the form of the effective external pulse signal. Thus, in the event that external sounds do not at all have a periodicity and are supplied at random rate, in other words, when the external period detection unit 105 cannot detect the external period, it is possible to prevent a disturbance of the oscillation, which would occur when the oscillation apparatus intends to synchronize with the random signals.

The state quantity control unit 103 is operative in response to a detection of the external pulse by the pulse signal detection unit 102 to increase (or decrease) a state quantity x of a pulse oscillation unit 104 by a state variation amount K set up by the state variation amount setting unit 107.

Next, there will be described a case in which a rate control ability of an oscillation apparatus to the external signal is dynamically varied.

The state variation amount setting unit 107 alters a state variation amount K of the oscillation apparatus to the external pulse. For example, in the event that a musical performance is given at a tempo outputted from the oscillation apparatus, if the music is actually on performance, it is difficult to rapidly change the tempo. Consequently, there is a need to set up the state variation amount K to do not have much. However, if it is a stage such that it is intended to establish a synchronization of one's own tempo with sounds given by a person's musical performance, and it is before the initiation of one's own musical performance, it is preferable that the state variation amount K of the oscillation apparatus is set up to be large so that the one's own oscillation state is synchronized with sounds given by a person's musical performance as soon as possible. According to the state variation amount setting unit 107, it is possible to dynamically vary one's own rate control ability in compliance with conditions such as a utility state of the oscillation.

Next, there will be described a case in which a tolerance ability of an oscillation apparatus to a fluctuation and a delay of sounds entered from the exterior is varied.

The state quantity variation factor setting unit 110 alters the state quantity variation factor γ. For example, if emphasis is put on the purpose of a musical education, a musical performance is given together between two parties mutually keeping a certain tempo, it is desired that when the tempo of sounds entered from the exterior fluctuated, one urges the another party to regulate the tempo, keeping one's own rate. On the other hand, if it is aimed that the musical performance is enjoyed more freely while mutually controlling their tempos, it is desired that even if the tempo of sounds emanated from the exterior fluctuated or delayed, one plays along to the another as much as possible. In order to vary the tolerance ability for the fluctuation or the delay of the external input in compliance with the situations, it is effective that the state quantity variation factor γ is varied. Providing a large state quantity variation factor γ implies, as mentioned above, that the tolerance ability for the fluctuation or the delay of the external period is increased. Oppositely, the oscillation of the oscillation apparatus serves to take precedence over an establishment of a synchronization with the external period, so that a stability of the oscillation is lowered in priority. In this manner, it is possible to set up, in accordance with an importance of the tempo of sounds entered from the exterior, a degree as to whether a synchronization is to be kept as much as possible, even if the tempo of the external period is fluctuated, or one's own oscillation rate is to be kept as much as possible, if the tempo of the external period is fluctuated.

Next, there will be described a case in which a continuous oscillation synchronized with the external period is carried out.

It happens for the oscillation apparatus that the state quantity x makes rapid variation to establish a synchronization. This implies that a phase of the oscillation apparatus makes rapid variation. However, when one's movements, such as playing a melody or moving one's body, are made, it happens that jumps of a melody or a position of one's body appear when a situation of a progress of the melody or a position of one's body are determined on the basis of the phase at that time. This may give affected feelings. The use of the continuous oscillation unit 111 makes it possible to perform an oscillation synchronized with the external period, while avoiding affected jumps in phase.

Further, there will be described a case in which when the external period slowly varies, the fundamental frequency of the oscillating apparatus is subjected to a fine control so as to keep a synchronization state of 1:1.

Figure 9:
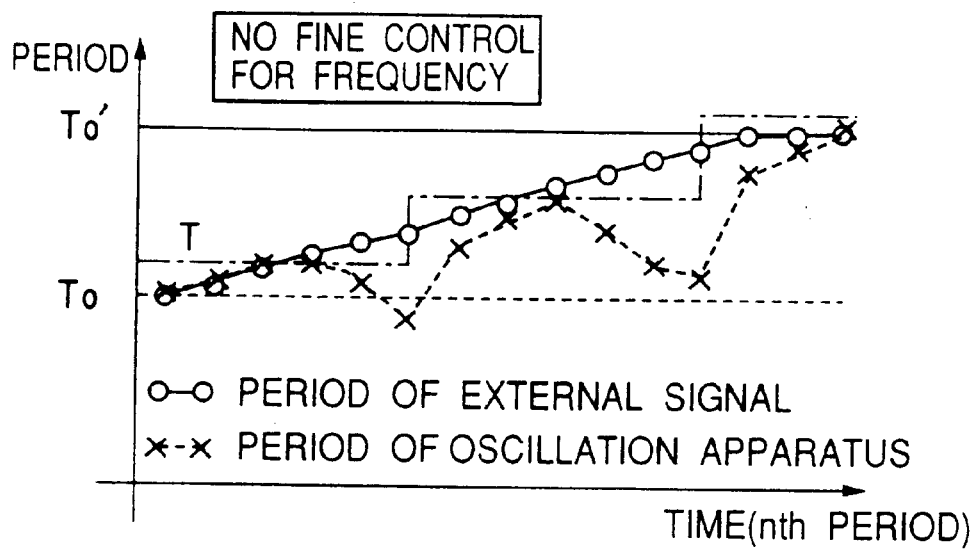
FIG. 9 is a view useful for understanding an effect in which the oscillation apparatus has no fine regulation function for the fundamental frequency.
Figure 10:
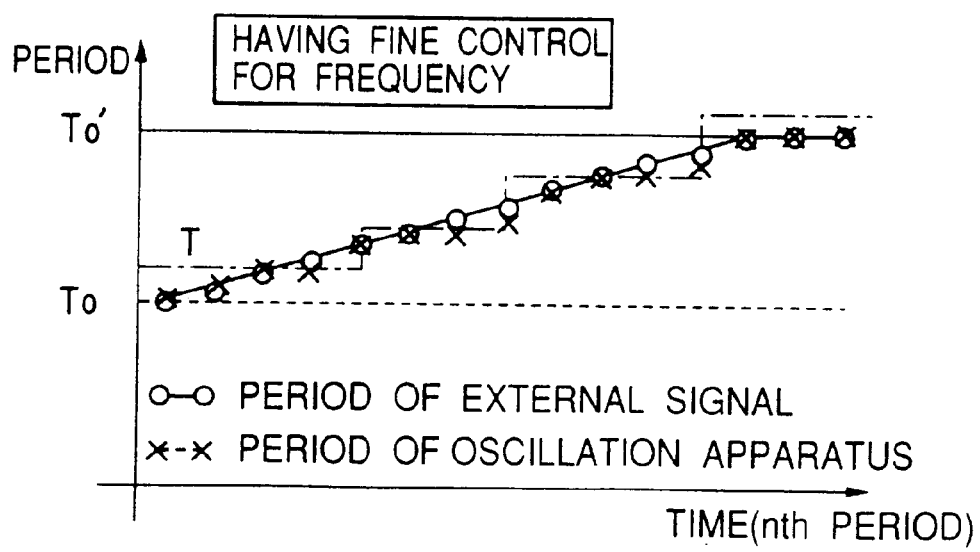
FIG. 10 is a view useful for understanding an effect in which the oscillation apparatus has a fine regulation function for the fundamental frequency.

The oscillation apparatus has such a property that the slower external period than the fundamental period determined by the fundamental frequency of the oscillation apparatus involves a phase lock state of a suitable rational number ratio such as 1:2. If it is desired to always establish a synchronization of 1:1, as mentioned before, it is effective that the fundamental frequency determination unit 106 sets up fundamental frequency Ω so that the natural period T of the oscillation apparatus delays a little as compared with the external period $T_o$. However, the fundamental frequency determination unit 106 is to aim for a rough regulation of the frequency and simply alters the frequency only when a great variation occurs on the external period $T_o$. Consequently, in the event that the external period To varies slowly, as will be seen in FIG. 9, it may happen that the external period $T_o$ becomes larger than the natural period T determined in the fundamental frequency determination unit 106 and as a result the oscillation transfers to one involved in a synchronization of a rational number ratio such as 1:2. The phase difference evaluation unit 109 evaluates, at the time point that the external pulse signal is detected, a difference between the external pulse signal and the state quantity (phase) of the pulse oscillation unit 104, and determines as to whether the fundamental frequency Ω of the oscillation apparatus is too low or high on the basis of a variation in the recent phase difference. The fundamental frequency control unit 108 controls for some time the fundamental frequency control variable α based on a result of the determination by the phase difference evaluation unit 109. When the value of the fundamental frequency control variable α is suitable set up, as a result of the oscillation thereafter, the phase difference evaluation unit 109 determines that a proper frequency has been set up. Thus, utilizing the regulated variable α in the value as it is implies that the optimum value has been set up for an establishment of the synchronization with the external period in the form of the fundamental frequency utilized in the pulse oscillation unit 104. Thus, as shown in FIG. 10, a fundamental frequency optimum for a synchronization is always set up, so that the synchronization can be kept even when the external period is varied little by little.

Furthermore, there will be described a case in which an external pulse signal is generated by the oscillation apparatus according to the present embodiment, that is, a case in which the external pulse signal is generated through a combination of two oscillation apparatuses according to the present embodiment.

In this case, there is no existence of a master and slave relation between two oscillation apparatuses. Thus, there is formed a state of the mutual synchronization. Accordingly, it is possible to conduct an automatic musical performance between computer-to-computer mutually in synchronism with their tempo, for example, like as musics are played between person-to-person mutually in synchronism with their tempo.

As mentioned above, according to the present invention, in an oscillation apparatus which is needed to establish a synchronization with a pulse sequence applied from the exterior, even in the event that any information is not given beforehand on a repetitive frequency of the external pulse sequence, it is possible to set up one's own fundamental frequency suitably and then establish a synchronization with the external pulse sequence keeping a small phase difference with respect to the external pulse sequence. Also in the event that the external pulse sequence gradually varies in the period, it is possible to set up the fundamental frequency to a suitable value, since the synchronization is kept through always performing a fine control, thereby establishing a stable synchronization. Further, with respect to the fluctuation and delay of the external period itself as the target of the synchronization, which are treated hitherto as they are not to exist, it is possible to establish a synchronization while keeping a stability of one's own oscillation by means of implementing a function of altering a regulation ability of the oscillation apparatus.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An oscillation apparatus, comprising:

signal input means for receiving an external pulse train;

state quantity generating means for generating a state quantity having a value which is monotonously increased with the passage of time;

state quantity transition means which responds to a pulse from said signal input means by transferring a predetermined transition value to said state quantity generating means, wherein said state quantity generating means changes the value of the state quantity in response to the transferred predetermined transition value;

state quantity reset means for comparing the present value of the state quantity generated in said state quantity generating means with a predetermined threshold value, and resetting the present value of the state quantity generated in said state quantity generating means to a predetermined initial value when the value reaches the threshold value; and signal generating means for generating sequential signals which define periods having corresponding time intervals, such that said state quantity generating means resets the value of the state quantity to the predetermined initial value in response to the sequential signals, wherein said state quantity generating means generates the state quantity, which varies in value from the initial value toward the threshold value, while a variation rate of the value is decreased with the passage of time, except during transition of the value of the state quantity by said state quantity transition means, and during reset of the value of the state quantity.

2. An oscillation apparatus according to claim 1, wherein said oscillation apparatus further comprises variation factor designating means for designating a variation factor of the variation rate of a value of the state quantity with the passage of time.

3. An oscillation apparatus, comprising:

signal input means for receiving an external pulse train;

state quantity generating means for generating a state quantity having a value which is monotonously increased with the passage of time;

state quantity transition means which responds to a pulse from said signal input means by transferring a predetermined transition value to said state quantity generating means, wherein said state quantity generating means changes the value of the state quantity in response to the transferred predetermined transition value;

state quantity reset means for comparing the present value of the state quantity generated in said state quantity generating means with a predetermined threshold value, and resetting the present value of the state quantity generated in said state quantity generating means to a predetermined initial value when the present value reaches the threshold value; and signal generating means for generating sequential signals which define periods having corresponding time intervals, such that said state quantity generating means resets the state of the state quantity to the predetermined initial value in response to the sequential signals;

period detecting means for detecting a period of the pulses constituting the pulse train signal inputted through the signal input means; and initial variation rate designating means for designating an initial variation rate of the value of the state quantity reset to the initial value in accordance with the period detected by said period detecting means.

4. An oscillation apparatus according to claim 3, wherein said oscillation apparatus further comprises:

phase detecting means for detecting a phase between the pulse train signal inputted through the signal input means and the signal generated in the signal generating means; and initial variation rate fine control means for designating a fine control amount of the initial variation rate of the value of the state quantity reset to the initial value in accordance with the phase detected by the phase detecting means.

* * * * *